(12) United States Patent
Ellersick et al.

(10) Patent No.: US 7,427,866 B2
(45) Date of Patent: Sep. 23, 2008

(54) CALIBRATION METHOD AND SYSTEM THAT GENERATES AN ERROR SIGNAL FOR ADJUSTING THE TIME CONSTANT OF CIRCUIT TO BE CALIBRATED

(75) Inventors: William F. Ellersick, Sudbury, MA (US); Jennifer A. Lloyd, North Andover, MA (US); Daniel J. Mulcahy, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 215 days.

(21) Appl. No.: 11/224,642

(22) Filed: Sep. 12, 2005

(65) Prior Publication Data

US 2007/0057679 A1    Mar. 15, 2007

(51) Int. Cl.
*G01R 35/00* (2006.01)

(52) U.S. Cl. ...................................................... 324/601

(58) Field of Classification Search ...................... None
See application file for complete search history.

(56) References Cited

U.S. PATENT DOCUMENTS

| | | | | |
|---|---|---|---|---|
| 5,625,288 | A * | 4/1997 | Snyder et al. | 324/158.1 |
| 6,801,045 | B2 * | 10/2004 | Hamm et al. | 324/713 |
| 6,946,848 | B2 * | 9/2005 | Tauber et al. | 324/601 |
| 7,030,625 | B1 * | 4/2006 | Boudiaf et al. | 324/601 |
| 7,107,170 | B2 * | 9/2006 | Jamneala et al. | 702/107 |
| 2003/0020488 | A1 * | 1/2003 | Grebner et al. | 324/601 |
| 2004/0178997 | A1 * | 9/2004 | Gillespie et al | 345/173 |

* cited by examiner

*Primary Examiner*—Diego Gutierrez
*Assistant Examiner*—Jeff Natalini
(74) *Attorney, Agent, or Firm*—Iandiorio Teska & Coleman

(57) ABSTRACT

A system and method of calibration develops a function from which is generated a monotonic time response; a gating period is defined from the monotonic time response and any error in the frequency of a reference signal is determined during the gating period; from that error an error signal is generated for adjusting the time constant of a circuit to be calibrated.

27 Claims, 5 Drawing Sheets

US 7,427,866 B2

CALIBRATION METHOD AND SYSTEM THAT GENERATES AN ERROR SIGNAL FOR ADJUSTING THE TIME CONSTANT OF CIRCUIT TO BE CALIBRATED

FIELD OF THE INVENTION

This invention relates to an improved calibration method and system and more particularly to such a calibration system and method which operates asynchronously to adjust time constants as well as resistance of circuits to be calibrated.

BACKGROUND OF THE INVENTION

Calibration is necessary for circuits whose behavior depends on certain parameters e.g., resistance, capacitance, inductance or time constant, $\tau$. Circuits whose behavior may depend on resistance may include bias networks and termination cells. Circuits whose behavior may depend on time constants, $\tau$, may include filters, equalizers, VCOs and amplifiers. On-chip variation of resistance and of $\tau$ ($\tau$ being a function variously of resistance, capacitance, and inductance) is problematic. The solution has been to make the resistance and $\tau$s adjustable. An integrated circuit chip may have one or a number of circuits whose resistance and $\tau$s are to be calibrated. One way to provide for resistance adjustment is just to make the resistance manually adjustable; another is to have a number of resistances that are programmable by an external PROM, for example, to obtain the desired value. An automatic adjustable technique uses a pair of matched current sources that each provide a monotonic current (equal or precisely ratioed) to one of an external off-chip reference resistance and an on-chip internal resistance. The internal resistance is a replica of the resistance in the circuit to be calibrated. Any difference between the voltage on the off-chip reference resistance and the voltage on the on-chip internal resistance produces an error signal which represents as well the error between the reference resistance and the resistance in the circuit to be calibrated. This is so because the internal resistance is a replica of the resistance in the circuit to be calibrated: for example, both are on the same chip made by the same process. The error signal is used by a state machine to adjust the resistance in the circuit to be calibrated. Automatic adjustment of the time constant, $\tau$, or the implicated resistance, capacitance, or inductance in a circuit to be calibrated is more complicated. An external clock defines a period during which the frequency of an on-chip internal circuit which is a replica of the circuit to be calibrated is compared to a known, desired reference frequency. Any difference in the frequency indicates an error in the time constant $\tau$. That error is used by a state machine to adjust the resistance, capacitance, inductance in the circuit to be calibrated to bring its $\tau$ into conformance with the desired reference $\tau$.

BRIEF SUMMARY OF THE INVENTION

It is therefore an object of this invention to provide an improved calibration system and method.

It is a further object of this invention to provide such an improved calibration system and method which operates asynchronously without an external clock.

It is a further object of this invention to provide such an improved calibration system and method which requires only one pin access on a chip package.

It is a further object of this invention to provide such an improved calibration system and method which enables one or a number of circuits to be calibrated independently.

It is a further object of this invention to provide such an improved calibration system and method which can adjust both $\tau$ and resistance.

It is a further object of this invention to provide such an improved calibration system and method which can adjust $\tau$ by adjusting resistance or capacitance or inductance.

It is a further object of this invention to provide such an improved calibration system and method which can adjust resistances of various types, e.g. polysilicon, N-doped.

The invention results from the realization that an improved calibration system and method which in a preferred embodiment can adjust both $\tau$ and resistance in a circuit to be calibrated and can do so asynchronously without an external clock and requiring only one external pin connection can be achieved using a function to drive a time reference circuit to generate a monotonic time response for defining a gating period during which the error in the frequency of a reference signal is determined and generating from that error an error signal to adjust the time constant of a circuit to be calibrated.

The subject invention, however, in other embodiments, need not achieve all these objectives and the claims hereof should not be limited to structures or methods capable of achieving these objectives.

SUMMARY OF INVENTION

This invention features a calibration system including a function generator and a time reference circuit responsive to the function generator for generating a monotonic time response. A gate circuit response to the monotonic time response to define a predetermined gating period. There is a calibration circuit and a circuit to be calibrated. A control circuit determines the frequency of the output signal from the calibration circuit during a predetermined gating period and generates an error signal for adjusting the time constant of the circuit to be calibrated.

In a preferred embodiment the function generator may include a current source, a switching circuit, and a drive circuit for operating the switching circuit to generate the function. The function generator, the gate circuit, and the control circuit may be on-chip with the calibration circuit and the circuit to be calibrated and the time reference circuit may be off-chip. The off-chip time reference circuit may be connected to the on-chip circuits by a single pin. The time reference circuit may include a reference resistance and the calibration system may further include a resistance calibration circuit having an internal resistance and a comparison circuit responsive to the voltages on the reference resistance and internal resistance to generate an error signal for adjusting the resistance of a circuit to be calibrated. There may be a reference resistance in the time reference circuit. The monotonic time response may be an exponential time response. The exponential time response may be $1-e^{-t/\tau}$. The calibration circuit may be a replica of the circuit to be calibrated. The function generator may include a step function generator.

The invention also features a calibration system having a function generator for enabling a time reference circuit to generate a monotonic time response. There is a gate circuit responsive to the monotonic time response for defining a predetermined gating period. A control circuit determines the frequency of the output signal from a calibration circuit during the predetermined gating period and generates an error signal for adjusting the time constant of a circuit to be calibrated.

In a preferred embodiment the function generator may include a current source, a switching circuit, and a drive circuit for operating the switching circuit to generate the function. The function generator, the gate circuit, and the control circuit may be on-chip with the calibration circuit and the circuit to be calibrated and the time reference circuit may be off-chip. The off-chip time reference circuit may be connected to the on-chip circuits by a single pin. The time reference circuit may include a reference resistance and the calibration system may further include a resistance calibration circuit having an internal resistance and a comparison circuit responsive to the voltages on the reference resistance and internal resistance to generate an error signal for adjusting the resistance of a circuit to be calibrated. There may be a reference resistance in the time reference circuit. The monotonic time response may be an exponential time response. The exponential time response may be $1-e^{-t/\tau}$. The calibration circuit may be a replica of the circuit to be calibrated. The function generator may include a step function generator.

This invention features a calibration method including generating a function and generating a monotonic time response from the function. A defined gating period is generated for the monotonic time response. The error in the frequency of a reference signal is determined during that gating period and from that error an error signal is generated for adjusting the time constant of a circuit to be calibrated.

In a preferred embodiment the monotonic time response is generated off-chip and the function, gating period and error signal are generated on-chip. Further the voltages on a reference resistance and an internal resistance may be compared to generate an error signal for adjusting the resistance of a circuit to be calibrated. The reference resistance may be off-chip and in the internal resistance may be on-chip. The monotonic time response may be an exponential time response. The exponential time response may be $1-e^{t/\tau}$. The calibration circuit may be a replica of the circuit to be calibrated. The function generator may include a step function generator.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
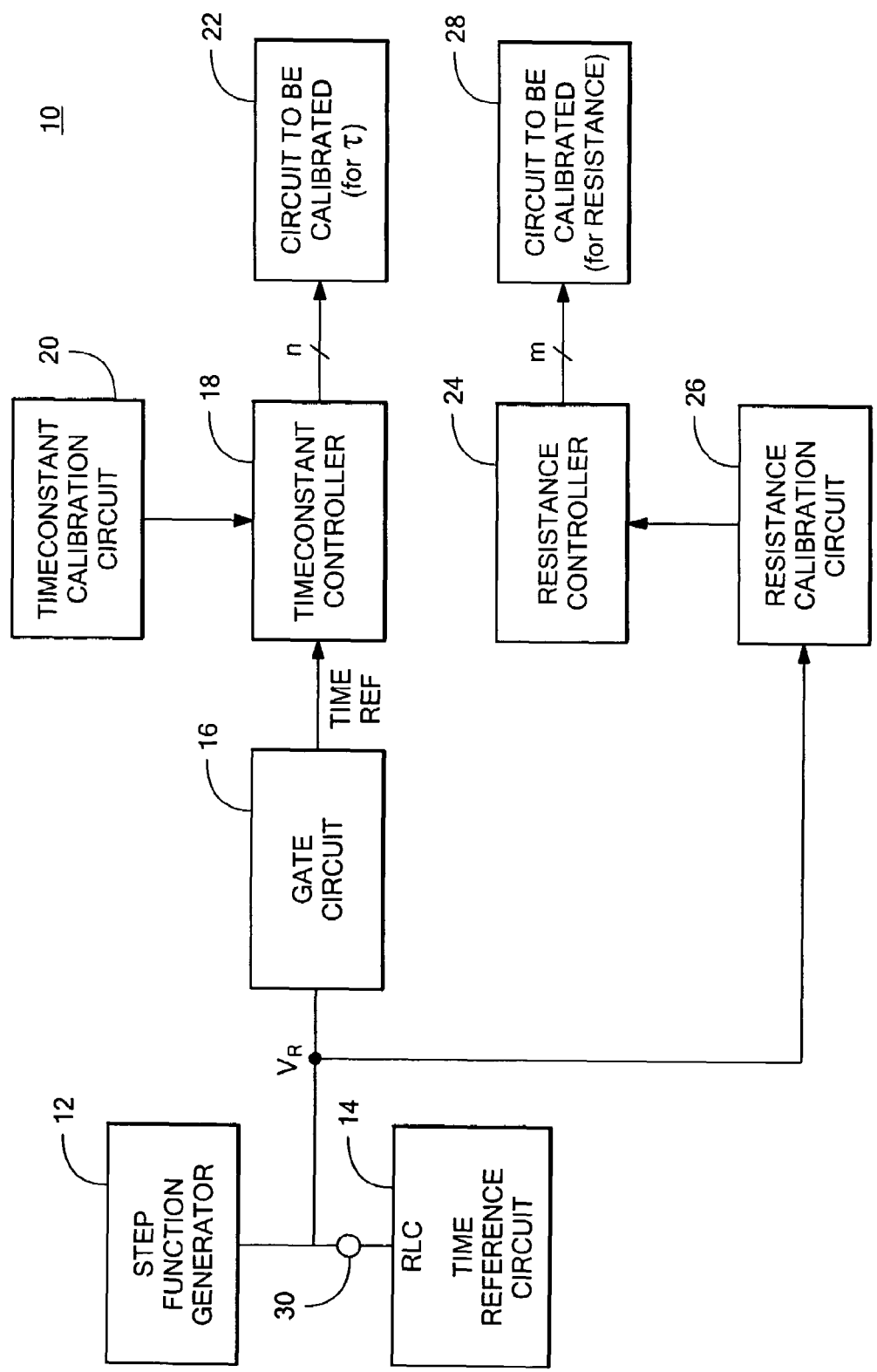
FIG. 1 is a schematic block diagram of a calibration system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1, a calibration system 10 including a function generator 12 and time reference circuit 14. Function generator 12 develops a step function to which time reference circuit 14 responds by generating a monotonic time response. However, any known or knowable function will do. A step function generator is employed in this example because it is an easy one to use. Time reference circuit 14 may include any combination of resistance inductance and capacitance required to establish a particular time constant τ. The monotonic time response is delivered to gate circuit 16 which defines a gating period based on two different times in the monotonic time response. During that time reference period, time constant controller 18 compares the frequency of the output of time constant calibration circuit 20 to a known predetermined frequency desired for the circuit to be calibrated 22. Time constant calibration circuit 20 and circuit to be calibrated 22 are replicas of one another. This may be done by similar configurations, processes, and fabrication. Thus, any error signal determined by time constant controller 18 with respect to the time constant of time constant calibration circuit 20 applies equally well to the circuit to be calibrated 22. Time constant controller 18 therefore responds to any error to create an error signal to be delivered to the circuit to be calibrated 22 to adjust its resistance, capacitance, inductance, to obtain the proper τ. The adjustment device actually used can be any one of those well known in the art and is not a part of this invention.

Calibration system 10 may also include a resistance controller 24, resistance calibration circuit 26 and a circuit to be calibrated 28. Resistance calibration circuit has an internal resistance and a current source or sources which apply matched currents to that internal resistance and an external resistance which may, for example, be in time reference circuit 14. The matched currents may be equal or precisely scaled. In either case any difference in the voltage $V_R$ of the external resistance and the voltage $V_I$ on the internal resistance indicates an error to which resistance control 24 responds by generating an error signal to adjust the resistance in the circuit to be calibrated 28.

Although only one circuit to be calibrated for τ22 is shown and only one circuit to be calibrated for resistance 28 is shown any number of these may be served as indicated by the number n for the number of lines out of time constant controller 18 and by the number m for the number of lines out of resistance controller 24. m and n need not be equal. For each of the circuits to be calibrated for τ22 there is an associated time constant calibration circuit 20. Likewise for each circuit to be calibrated for resistance 28 there is an associated resistance calibration circuit 26, each being the replica of the other. All of the components with the exception of time reference circuit 14 may be on a single chip so that all the parts are formed by the same process in the same way making for a close replication of similar circuits. Further this invention allows the entire operation to be performed through only one external pin 30 connected to the off-chip time reference circuit 14 so that the customer need only connect their preferred time reference circuit 14 to pin 30 to calibrate all of the circuits to be calibrated for τ22 and all of the circuits to be calibrated for resistance 28 as opposed to having to supply other circuits and external clocks.

Figure 2:
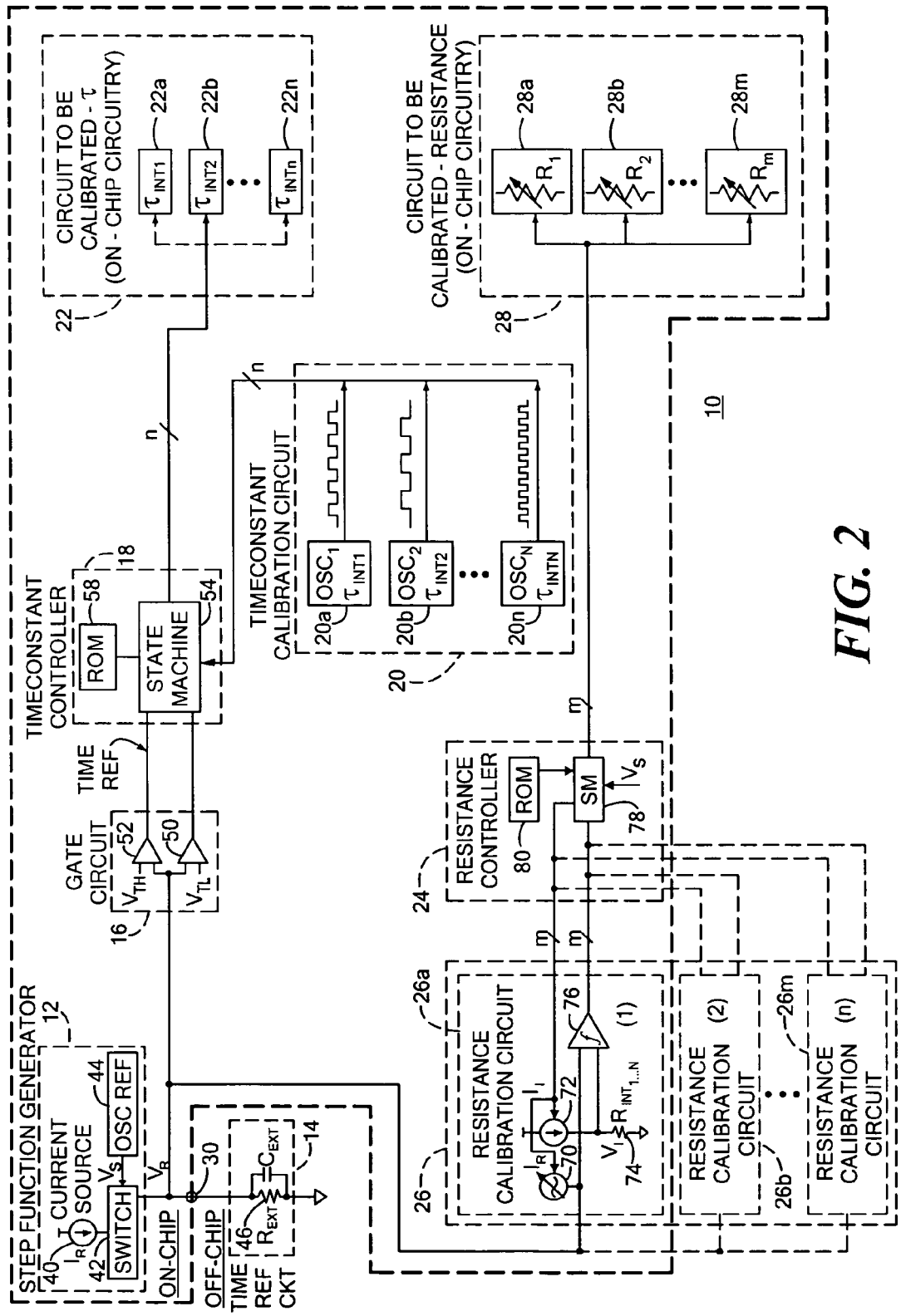
FIG. 2 is a more detailed schematic diagram of the calibration system of FIG. 1.

Step function generator 12 may include current source 40, FIG. 2, which provides a current $I_R$ to a switch circuit 42 which is periodically triggered by an oscillator reference 44. Time reference circuit 14 may include any combination of resistance, capacitance, and inductance necessary to provide the proper time constant τ. In this particular case there is one external reference resistance 46 and external capacitance 48.

Gate circuit 16 includes a pair of threshold amplifiers 50, 52. When the voltage $V_R$ exceeds $V_{TH}$ a pulse is provided by amplifier 50 beginning the gate period which is ended when the voltage $V_R$ exceeds the upper limit voltage $V_{TH}$. During that time a logic circuit such as state machine 54 in time constant controller 18 determines the frequency of the output signal from calibration circuit oscillator τ20a, compares it to a desired frequency stored in read only memory 58 and if there is a difference provides an error signal to circuit to be calibrated τ22a. This can be done for any number of circuits to be calibrated 22a-22n with ROM 58 be used to select the proper respective time constant calibration circuit 20a-n in each case.

Resistance calibration circuit 26 may include one 26a resistance calibration circuit or a number of such circuits 26a-26m. Illustratively, resistance calibration circuit 26a includes matched current sources 70, 72 which may provide equal or at least precisely scaled currents to external reference resistance 46 and internal resistance 74. If the voltage $V_I$ across internal resistance 74 differs from that of voltage $V_R$ across external reference resistance 46, comparator circuit 76 indicates an error to state machine 78 in resistance controller 24 which responds by providing an error to circuit to be calibrated 28a. Similarly under the control of ROM 80 state machine 78 will pair up resistance calibration circuit 26b with circuit to be calibrated 28b and so on until resistance calibration circuit 26m is paired with circuit to be calibrated 28m.

Figure 3:
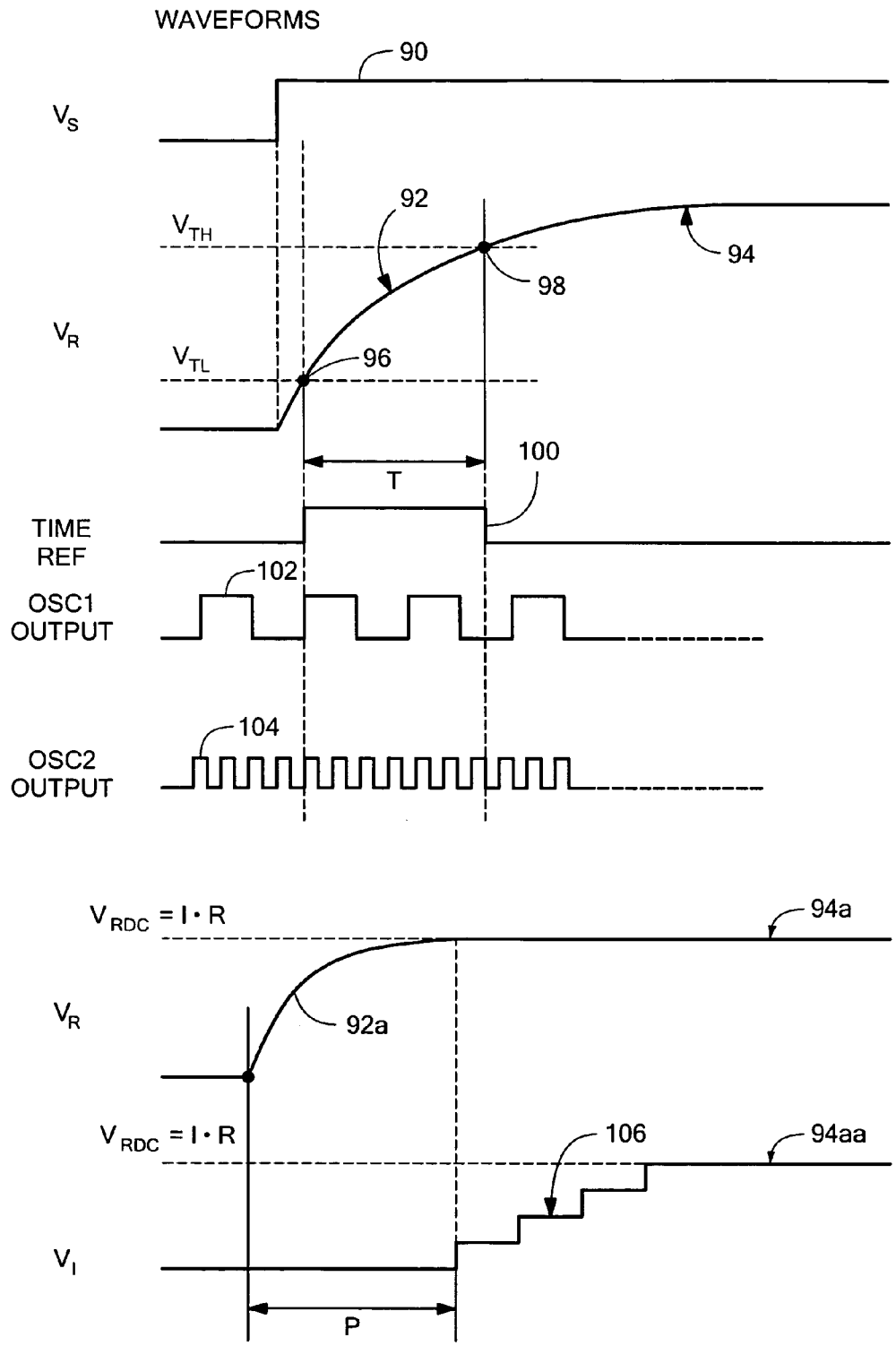
FIG. 3 illustrates waveforms occurring in the system of FIG. 2.

The operation of calibration system 10, FIGS. 1 and 2, may be better understood with respect to the wave forms shown in FIG. 3 and referring to FIG. 2. When oscillator reference 44 provides a step function Vs 90 to operate switch 42, switch 42 passes a current $I_R$ into time reference circuit 46 where it charges capacitance 48 exponentially as indicated as 92 until it reaches the final voltage at 94. In this embodiment the monotonic time response is chosen to be exponential and specifically may be $IR(1-e^{t/\tau})$. Since resistance 46 and capacitance 48 are known, this monotonic time constant 92 is also known and is repeatable. By choosing two points $V_{TL}$ 96 and $V_{TH}$ 98 a gating time period T is defined which is precise and repeatable. This creates the gating time pulse or window 100 delivered to state machine 54. During that period calibration circuit 20a provides an output 102 whose frequency during that gate period T 100 is determined by state machine 54. If there is a difference between that frequency and the desired frequency stored in ROM 58 an error is indicated and state machine 54 will provide an error signal to the circuit to be calibrated τ22a. Similarly, if it is desired to calibrate the time constant of circuit to be calibrated τ22b the output 104 of calibration circuit 20b is monitored during a gate period T 100 and it will be compared to the desired frequency stored in ROM 58 associated with circuit to be calibrated τ22b. A difference indicates an error from which state machine 54 generates an error signal to adjust the circuit to be calibrated τ22b.

If the system is to perform calibrations with respect to resistances as opposed to time constants state machine 78, FIG. 2, having one input $V_S$ monitors the occurrence of $V_S$ emitted by oscillator reference 44 to operate switch 42. After a reasonable time period P, FIG. 3, when $V_R$ has passed through its exponential phase 92a and reached a steady state condition 94a, state machine 78 enables current sources 70 and 72 to provide a stepped 106 increase in the current until the voltage $V_I$ reaches the level 94aa. During this time the voltages $V_R$ and $V_I$ are compared by comparator 76, for example, and if there is a difference indicating an error, state machine 78 generates an error signal for resistance circuit to be calibrated 28a. Similarly all of the resistance circuits to be calibrated 28a-28m may be calibrated using resistance calibration circuits 26a-26m.

Figure 4:
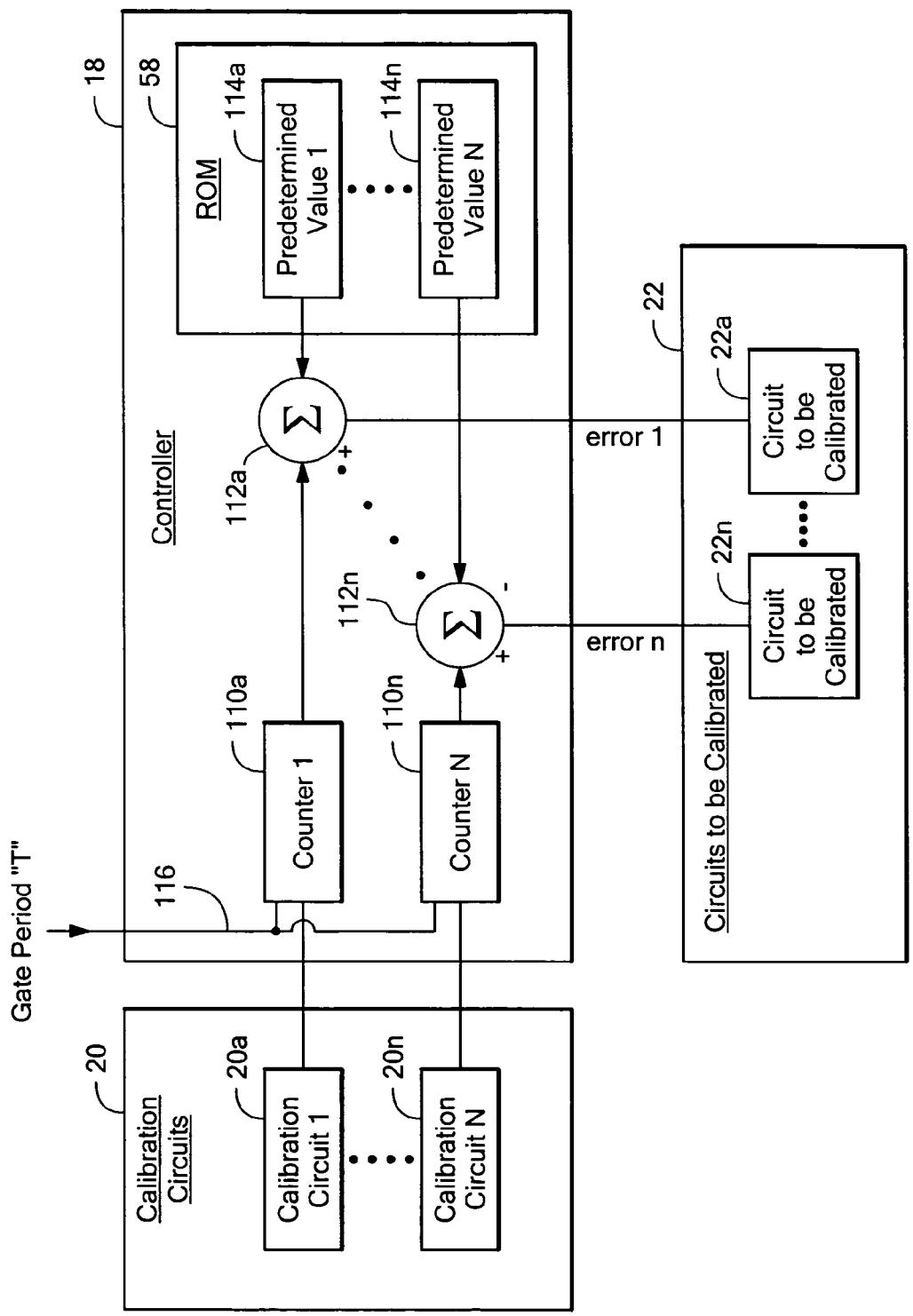
FIG. 4 is an enlarged, more detailed view of a portion of the time constant controller of FIG. 2.

Controller 18, FIG. 4, may include a counter 110a-110n associated with each of calibration circuits 20a-20n. Also associated with each one is a comparator or summing circuit 112a-112n and in ROM 58 there is stored a predetermined value 114a-114n also associated with the respective counter 110a-110n. During a gate period provided on line 116, counter 110a counts the cycles from calibration circuit 20a and provides that count to summing circuit 112a along with the predetermined value 114a stored in ROM 58. Any difference creates an error signal which is provided to adjust the circuit to be calibrated 22a. Similarly, each one of the other circuits to be calibrated through 22b-n can be dealt with using the associated calibration circuit 20a-n, counter 110a-n, summer or comparator 112a-n, and predetermined values 114a-n stored in ROM 58.

Figure 5:
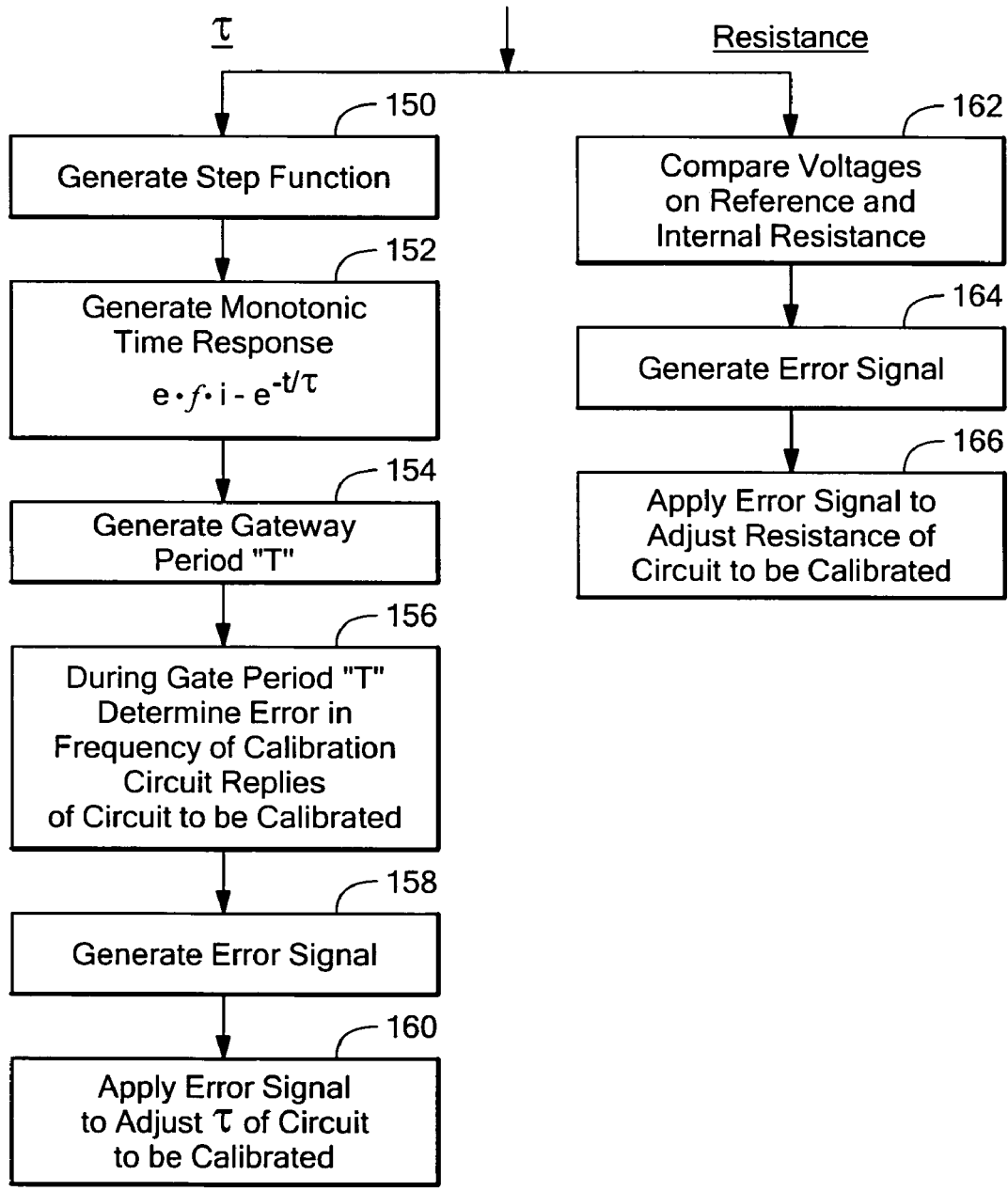
FIG. 5 is a flow chart of one embodiment of the method of this invention.

An implementation of the method according to this invention appears in FIG. 5. In adjusting the time constant for a circuit to be calibrated the first step is to generate a step function, 150, and then from that generate a monotonic time response, 152. From two predetermined times in the time response a gating period is defined, 154. During this gate period if an error is determined in the frequency of the calibration circuit, an error is generated, 158, which is applied to adjust the τ, 160, of the circuit to be calibrated. In the same way and even on the same chip the resistance may be adjusted for a circuit to be calibrated. This can be done by comparing the voltage on a reference resistance and an internal resistance, step 162, then generating an error signal, 164, and applying that error signal, 166, to adjust the resistance of the circuit to be calibrated.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A calibration system comprising:
   a function generator;
   a time reference circuit responsive to said function generator for generating a monotonic time response;
   a gate circuit responsive to said monotonic time response for defining a predetermined gating period;
   a calibration circuit;
   a circuit to be calibrated; and
   a control circuit for determining the frequency of the output signal from said calibration circuit during said predetermined gating period for generating an error signal for adjusting the time constant of said circuit to be calibrated.

2. The calibration system of claim 1 in which said function generator includes a current source, a switching circuit and a drive circuit for operating said switching circuit to generate the function.

3. The calibration system of claim 1 in which said function generator said gate circuit and said control circuit are on a chip with said calibration circuit and said circuit to be calibrated and said time reference circuit is off-chip.

4. The calibration system of claim 3 in which said off-chip timing reference circuit is connected to the on-chip circuits by a single pin.

5. The calibration system of claim 1 in which said time reference circuit includes a reference resistance and the calibration system further includes a resistance calibration circuit having an internal resistance and a comparison circuit responsive to the voltages on the reference resistance and internal resistance to generate an error signal for adjusting the resistance of a circuit to be calibrated.

6. The calibration system of claim 5 in which said reference resistance is in said time reference circuit.

7. The calibration system of claim 1 in which said monotonic time response is an exponential time response.

8. The calibration system of claim 7 in which said exponential time response is equal to $(1-e^{-t/\tau})$.

9. The calibration system of claim 1 in which said calibration circuit is a replica of the circuit to be calibrated.

10. The calibration system of claim 1 in which said function generator includes a step function generator.

11. A calibration system comprising:
a function generator for enabling a time reference circuit to generate a monotonic time response;
a gate circuit responsive to said monotonic time response for defining a predetermined gating period; and
a control circuit for determining the frequency of the output signal from a calibration circuit during said predetermined gating period for generating an error signal for adjusting the time constant of a circuit to be calibrated.

12. The calibration system of claim 11 in which said function generator includes a current source, a switching circuit and a drive circuit for operating said switching circuit to generate the function.

13. The calibration system of claim 11 in which said function generator said gate circuit and said control circuit are on a chip with said calibration circuit and said circuit to be calibrated and the timing reference circuit is off-chip.

14. The calibration system of claim 13 in which the off-chip time reference circuit is connected to the on-chip circuits by a single pin.

15. The calibration system of claim 11 in which said time reference circuit includes a reference resistance and the calibration system further includes a resistance calibration circuit having an internal resistance and a comparison circuit responsive to the voltages on the reference resistance and internal resistance to generate an error signal for adjusting the resistance of the circuit to be calibrated.

16. The calibration system of claim 11 in which said reference resistance is in the time reference circuit.

17. The calibration system of claim 11 in which said monotonic time response is an exponential time response.

18. The calibration system of claim 17 in which said exponential time response is $(1-e^{-t/\tau})$.

19. The calibration system of claim 11 in which the calibration circuit is a replica of the circuit to be calibrated.

20. The calibration system of claim 11 in which said function generator includes a step function generator.

21. A calibration method comprising:
generating a function;
generating a monotonic time response from the function;
generating a defined gate period from said monotonic time response;
determining error in the frequency of a reference signal during that gating period; and
generating from that error an error signal for adjusting the time constant of a circuit to be calibrated.

22. The calibration method of claim 21 in which the monotonic time response is generated off-chip and the function, gating period and error signal are generated on-chip.

23. The calibration method of claim 21 further including comparing the voltages on a reference resistance and an internal resistance to generate an error signal for adjusting the resistance of a circuit to be calibrated.

24. The calibration method of claim 23 in which the reference resistance is off-chip and said internal resistance is on-chip.

25. The calibration system of claim 21 in which said monotonic time response is an exponential time response.

26. The calibration system of claim 25 in which said exponential time response is equal to $(1-e^{-t/\tau})$.

27. The calibration system of claim 21 in which said function generator includes a step function generator.

* * * * *